United States Patent
Tu et al.

(10) Patent No.: US 8,349,742 B2
(45) Date of Patent: Jan. 8, 2013

(54) GALLIUM NITRIDE-BASED SEMICONDUCTOR DEVICE AND METHOD FOR MANUFACTURING THE SAME

(75) Inventors: Po-Min Tu, Hsinchu (TW); Shih-Cheng Huang, Hsinchu (TW); Shun-Kuei Yang, Hsinchu (TW); Chia-Hung Huang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 114 days.

(21) Appl. No.: 13/013,825

(22) Filed: Jan. 26, 2011

(65) Prior Publication Data

US 2012/0018847 A1 Jan. 26, 2012

(30) Foreign Application Priority Data

Jul. 22, 2010 (CN) .......................... 2010 1 0233173

(51) Int. Cl.
*H01L 21/00* (2006.01)

(52) U.S. Cl. ............ 438/763; 438/41; 438/44; 438/478; 438/424; 117/952; 257/E33.025

(58) Field of Classification Search .................... 438/41, 438/44, 478, 424, 429, FOR. 134, FOR. 396; 117/952; 257/E33.025
See application file for complete search history.

(56) References Cited

U.S. PATENT DOCUMENTS

| | | | |
|---|---|---|---|
| 7,008,839 B2 * | 3/2006 | Ueda et al. ................ | 438/240 |
| 7,186,620 B2 * | 3/2007 | Otsuka et al. .............. | 438/285 |
| 7,229,926 B2 * | 6/2007 | Matsumoto ................ | 438/691 |
| 7,405,139 B2 * | 7/2008 | Daubenspeck et al. ....... | 438/475 |
| 2008/0142846 A1 * | 6/2008 | Kim et al. .................. | 257/200 |

* cited by examiner

*Primary Examiner* — Thanh V Pham
(74) *Attorney, Agent, or Firm* — Altis Law Group, Inc.

(57) ABSTRACT

A gallium nitride-based semiconductor device includes a composite substrate and a gallium nitride layer. The composite substrate includes a silicon substrate and a filler. The silicon substrate includes a first surface and a second surface opposite to the first surface, and the first surface defines a number of grooves therein. The filler is filled into the number of grooves on the first surface of the silicon substrate. A thermal expansion coefficient of the filler is bigger than that of the silicon substrate. The gallium nitride layer is formed on the second surface of the silicon substrate.

8 Claims, 3 Drawing Sheets

GALLIUM NITRIDE-BASED SEMICONDUCTOR DEVICE AND METHOD FOR MANUFACTURING THE SAME

BACKGROUND

1. Technical Field

The present disclosure relates to semiconductor devices and, particularly, to a gallium nitride-based semiconductor device and a method for manufacturing the gallium nitride-based semiconductor device.

2. Description of Related Art

Gallium nitride has a relatively wide, direct band gap which permits highly energetic electronic transitions to occur. Such electronic transitions can result in gallium nitride having a number of attractive properties including the ability to efficiently emit blue light, the ability to transmit signals at high frequency, and others. Accordingly, gallium nitride is being widely used in many microelectronic applications such as transistors, field emitters, and optoelectronic devices.

At present, a mainstream method for forming a gallium nitride layer is growing the gallium nitride layer on a sapphire substrate; however, because the sapphire substrate has an inferior heat-conducting property and is very expensive, more and more silicon substrates are used for growing the gallium nitride layer. However, referring to FIG. 3, the gallium nitride has a different thermal expansion coefficient from that of the silicon substrate. This difference in thermal expansion can lead to crack of a gallium nitride layer deposited on the silicon substrate when the structure is cooled, for example, during a processing of the semiconductor structure. The cracks in the gallium nitride layer significantly affect the production yield of the semiconductor device.

What is needed is a substrate which can ameliorate the problem of the prior art.

BRIEF DESCRIPTION OF THE DRAWINGS

Many aspects of the present gallium nitride-based semiconductor device and method for manufacturing the same can be better understood with reference to the accompanying drawings. The components in the drawings are not necessarily drawn to scale, the emphasis instead being placed upon clearly illustrating the principle of the gallium nitride-based semiconductor device and the method for manufacturing the gallium nitride-based semiconductor device. In the drawings, all the views are schematic.

DETAILED DESCRIPTION

Embodiments of the present disclosure will now be described in detail below, with reference to the accompanying drawing.

Figure 1:
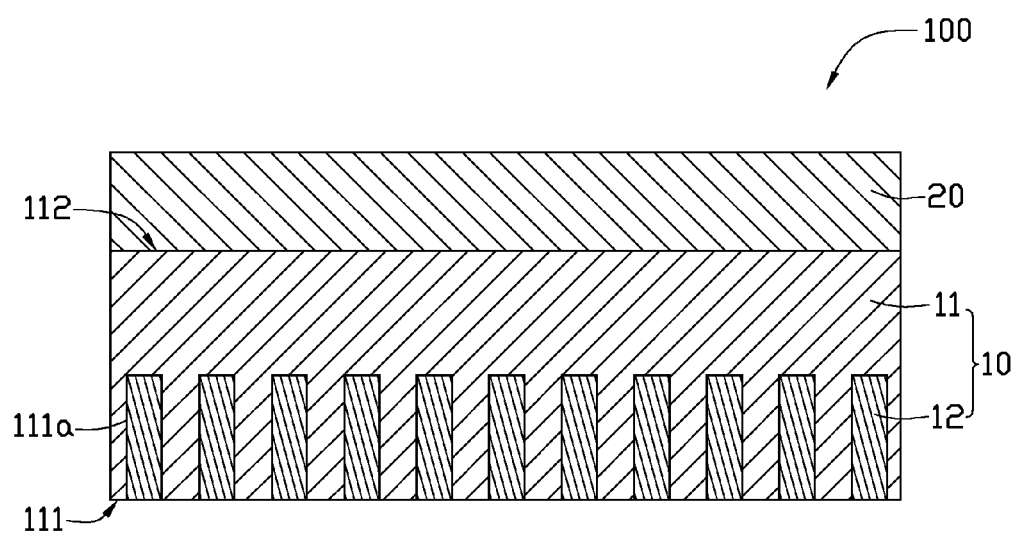
FIG. 1 is a schematic, cross-sectional view of a gallium nitride-based semiconductor device according to an exemplary embodiment.

Referring to FIG. 1, a gallium nitride-based semiconductor device 100 according to an exemplary embodiment is shown. The gallium nitride-based semiconductor device 100 includes a composite substrate 10 and a gallium nitride layer 20. The gallium nitride-based semiconductor device 100 can be a solar cell, a light emitting diode, a semiconductor laser or the like.

The composite substrate 10 includes a silicon substrate 11 and a filler 12. The silicon substrate 11 includes a first surface 111 and a second surface 112 opposite to the first surface 111. The first surface 111 defines a number of grooves 111a therein.

The filler 12 is filled into the grooves 111a. The thermal expansion rate of the filler 12 is bigger than that of the silicon substrate 11, and thus when the composite substrate 10 is heated, the filler 12 will expand to press the silicon substrate 11 outwardly. Therefore, the composite substrate 10 will have a bigger thermal expansion rate when heated in comparison with the condition if the composite substrate 10 is entirely made of silicon. Accordingly, the difference of the thermal expansion rates between the composite substrate 10 and the gallium nitride layer 20 will be decreased. In order to achieve that the filler 12 can apply a uniform press force to the silicon substrate 11, the grooves 111a can be uniformly arranged in the first surface 111 and have a same depth. In order to achieve that the filler 12 can apply a sufficient expansion force to the silicon substrate 11, the depth of the grooves 111a can be in a range from one third of the thickness of the silicon substrate 11 to a half of the thickness of the silicon substrate 11. Preferably, the thermal expansion rate of the filler 12 is smaller than that of the gallium nitride layer 20. The filler 12 can be selected from the group consisting of $Al_2O_3$, SiC, AlN, InN, MgN, ZnO, GaAs, GaP and Ge.

The gallium nitride layer 20 is formed on the second surface 112 of the silicon substrate 11. The gallium nitride layer 20 can be formed on the second surface 112 by metal organic chemical vapor deposition (MOCVD) etc.

Figure 2:
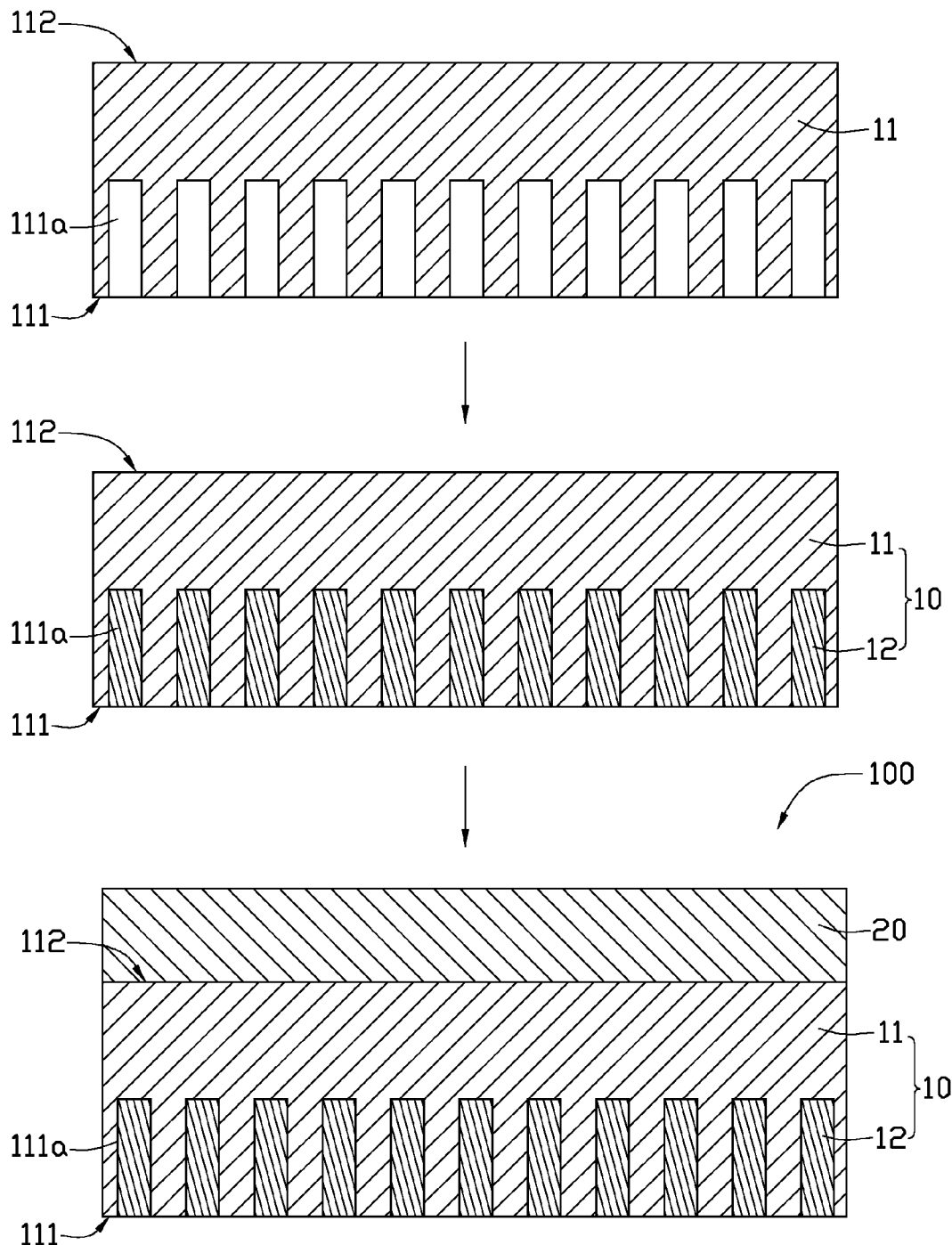
FIG. 2 is a schematic view of a method for manufacturing a gallium nitride-based semiconductor device according to an exemplary embodiment.
Figure 3:
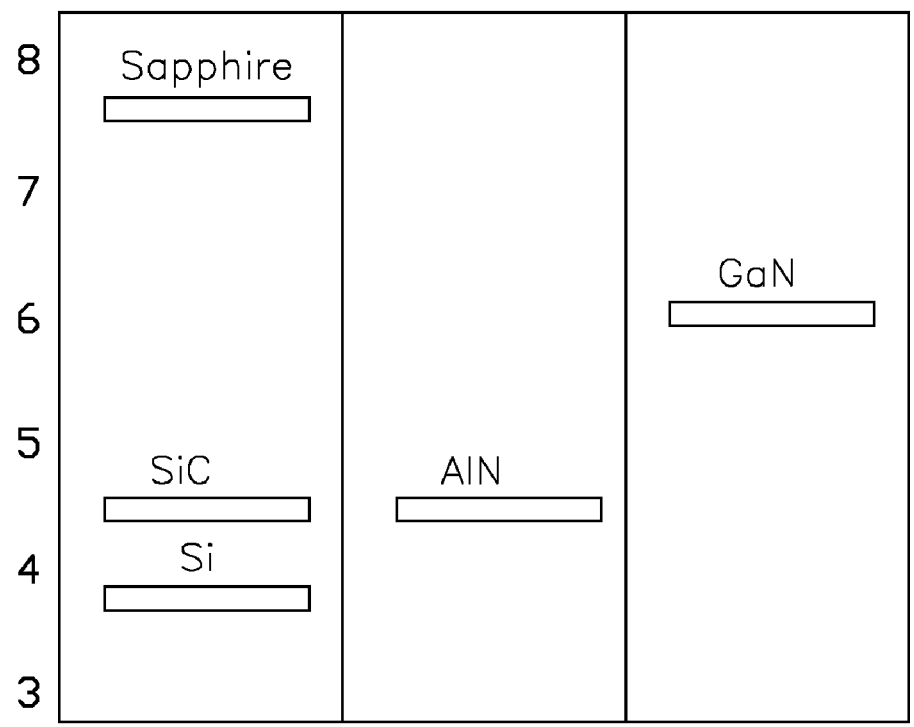
FIG. 3 is graph showing the thermal expansion coefficients of silicon, gallium nitride, sapphire, silicon carbide and aluminum nitride.

Referring to FIG. 2, from top to bottom, three steps of a method for manufacturing the gallium nitride-based semiconductor device 100 according to an exemplary embodiment are shown. The method includes following steps:

The first step is to provide a silicon substrate 11. The silicon substrate 11 includes a first surface 111 and a second surface 112 opposite to the first surface 111. The first surface 111 defines a number of grooves 111a therein.

Then, the filler 12 is filled into the grooves 111a. The thermal expansion rate of the filler 12 is bigger than that of the silicon substrate 11. The filler 12 can be filled into the grooves 111a by many methods, such as evaporation plating, spluttering, atomic layer deposition, and metal organic chemical vapor deposition.

Thereafter, the gallium nitride layer 20 is formed on the second surface 112 of the silicon substrate 11 to obtain the gallium nitride-based semiconductor device 100. The gallium nitride layer 20 can be formed on the second surface 112 by metal organic chemical vapor deposition (MOCVD) etc.

In the present embodiment, because the grooves 111a on the first surface 111 of the silicon substrate 11 are filled by the filler 12 having a bigger thermal expansion rate than that of the silicon substrate 11, when the composite substrate 10 is heated, the filler 12 will expand and press the silicon substrate 11 outwardly; therefore, the composite substrate 10 will have a bigger thermal expansion in comparison with the situation if the composite substrate 10 is entirely made of silicon. Accordingly, the difference of thermal expansion rates between the composite substrate 10 and the gallium nitride layer 20 will be decreased, and the possibility of formation of cracks in the gallium nitride layer 20 formed on the silicon substrate 11 during cooling can be decreased. Therefore, the production yield of the semiconductor device 100 can be improved.

While certain embodiments have been described and exemplified above, various other embodiments will be apparent to those skilled in the art from the foregoing disclosure. The disclosure is not limited to the particular embodiments described and exemplified, and the embodiments are capable of considerable variation and modification without departure from the scope and spirit of the appended claims.

What is claimed is:

1. A method for manufacturing a gallium nitride-based semiconductor device comprising:
    providing a silicon substrate, the silicon substrate comprising a first surface and a second surface opposite to the first surface, the first surface defining a plurality of grooves therein;
    filling a filler into the plurality of grooves, a thermal expansion coefficient of the filler being bigger than that of the silicon substrate; and
    forming a gallium nitride layer on the second surface of the silicon substrate.

2. The method as claimed in claim 1, wherein the plurality of grooves are uniformly arranged in the first surface.

3. The method as claimed in claim 1, wherein the plurality of grooves have a same depth.

4. The method as claimed in claim 1, wherein the depth of the grooves is in a range from a half of the thickness of the silicon substrate to one third of the thickness of the silicon substrate.

5. The method as claimed in claim 1, wherein the filler is selected from the group consisting of $Al_2O_3$, SiC, AN, InN, MgN, ZnO, GaAs, GaP and Ge.

6. The method as claimed in claim 1, wherein the thermal expansion coefficient of the filler is smaller that of the gallium nitride layer.

7. The method as claimed in claim 1, wherein the filler is filled into the grooves by evaporation plating, sputtering, atomic layer deposition, or metal organic chemical vapor deposition.

8. The method as claimed in claim 1, wherein the gallium nitride layer is formed on the second surface by metal organic chemical vapor deposition.

* * * * *